United States Patent [19]

Walker et al.

[11] 4,000,476
[45] Dec. 28, 1976

[54] PHASE LOCKED LOOP WITH CIRCUIT FOR PREVENTING SIDELOCK

[75] Inventors: Andrew M. Walker, Gaithersburg; David W. Matthews, Mount Airy, both of Md.

[73] Assignee: Digital Communications Corporation, Gaithersburg, Md.

[22] Filed: Nov. 7, 1975

[21] Appl. No.: 629,953

Related U.S. Application Data

[63] Continuation of Ser. No. 534,389, Dec. 19, 1974, abandoned.

[52] U.S. Cl. .............................. 331/17; 325/346; 325/419; 329/122; 331/4; 331/19; 331/23; 331/25
[51] Int. Cl.[2] ..................... H03B 3/04; H03D 3/00
[58] Field of Search ............. 331/4, 17, 18, 19, 23, 331/25; 329/122, 124, 125; 325/346, 349, 419, 423

[56] References Cited

UNITED STATES PATENTS

| | | | |
|---|---|---|---|
| 3,421,105 | 1/1969 | Taylor | 331/25 X |
| 3,768,030 | 10/1973 | Brown et al. | 331/17 X |
| 3,810,036 | 5/1974 | Bloedorn | 331/17 X |

*Primary Examiner*—Siegfried H. Grimm
*Attorney, Agent, or Firm*—Pollock, Vande Sande & Priddy

[57] ABSTRACT

A side lock detector to prevent side lock in coherent PSK demodulation. For demodulation purposes it is necessary to recreate the carrier at the receiver. This may be accomplished with a phase-locked loop. However, with plural phase PSK modulation the input signal to the phase-locked loop has energy at side bands spaced at modulation rate intervals from the desired lock frequency as well as at the desired lock frequency. To detect side band lock, a band pass filter monitors the phase detector output of the phase-locked loop. The center frequency of the filter is equal to the modulation rate and the filter band width is very narrow. Only during side lock will significant amounts of energy pass the filter. This energy may be detected by a simple diode detector or the like. A lock inhibit means is provided, responsive to the output of the detector, to drive the voltage controlled oscillator out of a side lock condition.

22 Claims, 7 Drawing Figures

PHASE LOCKED LOOP WITH CIRCUIT FOR PREVENTING SIDELOCK

This is a continuation of application Ser. No. 534,389 filed Dec. 19, 1974, now abandoned.

FIELD OF THE INVENTION

The present invention relates to improvements in demodulation circuits and more particularly improvements in coherent or synchronous demodulation circuits which recreate a carrier in order to perform the demodulation process. More particularly, the present invention concerns an improved phase-locked loop which prevents the loop from being side locked to a side band frequency of the desired lock frequency.

BACKGROUND OF THE INVENTION

For quite some time now, the art has been aware of the advantages of modulation techniques in which the carrier is not transmitted. With the advent of phase-locked loops and techniques associated therewith the demodulation of suppressed carrier signals has been greatly simplified.

Briefly, a conventional phase-locked loop may include a phase detector, a low pass filter and voltage controlled oscillator. The controlled oscillator phase makes it capable of locking or synchronizing with an incoming signal. If the phase relationship changes, indicating the incoming frequency is changing, the phase detector output voltage increases or decreases just enough to keep the oscillator frequency the same as the incoming frequency, preserving the locked condition.

In many cases in suppressed carrier applications the suppressed carrier frequency actually changes due to phase shifts, downward shifts or other effects and the loop provides the demodulator with an excellent means for tracking this change in frequency to provide effective demodulation.

However, under certain circumstances the loop can be side locked. Side lock is an anomalous locking mode in which the phase-locked loop output frequency is not the desired lock frequency. For the conventional phase-locked loop, side lock is a stable condition. The difficulty is, of course, that in side lock the voltage controlled oscillator is not oscillating at the correct frequency to perform the necessary demodulation.

A discussion of side lock is found in Burst Synchronization of Phase-Locked Loops, by Leonard Schiff, found in IEEE Transactions on Communications, Volume COM-21 No. 10, October 1973 at pp. 1091 through 1099. This article teaches that side lock may be prevented by reducing the allowable offset between the carrier frequency and the voltage controlled oscillator natural frequency to be less than half the burst synchronizing rate. Of course, due to frequency uncertainty in longdistance transmissions, carrier frequency drifts and the like this may not be a practical alternative. As a further alternative the author employs a frequency discriminator to provide a voltage proportional to the difference between the carrier frequency and the lock frequency, where a carrier frequency is available. Again, depending upon the application this may or may not be practical.

A severe test of the phase-locked loop capabilities is found in demodulating PSK signals especially where there are plural phases. The prior art teaches that the carrier may be recreated by first multiplying the received signal, in frequency, by a number equal to the number of phases of modulation. The resulting signal is then applied to a phase-locked loop whose voltage controlled oscillator has natural frequency of N times the carrier (NFc). The output of the phase-locked loop is desirably then N times the carrier frequency (NFc) which, after division by N can be used for synchronous detection puposes. Such an arrangement is illustrated in FIG. 1.

The difficulty with this approach can be illustrated by noting that the spectral energy distribution at point A (in FIG. 1) is that shown in FIG. 2A. FIG. 2A shows the multiplied carrier frequency at a frequency of (NFc) and also shows a plurality of side bands spaced from either the carrier or another side band by the modulation rate $R_s$ of the PSK signal. If $R_s$ is relatively small, compared to the frequency uncertainty of the received carrier it may be difficult, or impossible, to design the phase-locked loop components to avoid side lock.

SUMMARY OF THE INVENTION

The present invention provides a side lock detector which cooperates with the conventional phase-locked loop to detect the side lock condition and energize a lock inhibit means to inhibit the phase-locked loop from remaining in the locked condition. In this fashion, the voltage controlled oscillator, of the phase-locked loop is driven to another locked condition. If the side band lock detector again detects a side lock, the voltage controlled oscillator is again driven out of the locked condition. In this fashion, the voltage controlled oscillator is quickly driven to the desired locked condition.

In order to detect the side lock a band pass filter is provided whose center frequency is equal to the modulation rate $R_s$ and whose pass band is very narrow compared to the center frequency. In the locked condition, that is with the voltage controlled oscillator oscillating at the desired lock frequency the phase detector output at the modulation rate frequency which is the only frequency that the band pass filter can pass, will be essentially zero. Only noise will contribute to the output of the band pass filter and, if the pass band is sufficiently narrow the noise output will be insignificant. A detector is provided to detect energy in the band pass filter output. The detector may be connected to a lock inhibit means which, cooperates with the voltage controlled oscillator to inhibit the phase-locked loop from remaining in a side lock condition.

In one embodiment, the lock inhibit means may merely comprise a relay which is connected to be energized by the output of the detector. As a result, the relay will only be energized in the presence of a side lock condition. Relay contacts may be arranged to ground the output or the input of the phase detector. When either of these locations is grounded the voltage controlled oscillator no longer receives an input and a locked condition is inhibited. As a further alternative, a sweep voltage may be added to the output of the low pass filter and provided as the controlling voltage to the voltage controlled oscillator. With such an arrangement, a lock detector de-energizes the sweep voltage during a locked condition. However, the detector output, in a side lock condition, energizes the sweep voltage to again drive the voltage controlled oscillator out of the locked condition.

By providing the detector with a relatively long time constant the lock inhibit means will remain effective until the oscillator has changed in frequency a sufficient amount to prevent the circuit from oscillating into and out of side lock.

BRIEF DESCRIPTION OF DRAWINGS

The characteristics and features of the present invention will become clear from a reading of this description taken in conjunction with the attached drawings in which like reference characters identify identical apparatus and in which.

DETAILED DESCRIPTION OF THE INVENTION

Figure 1:
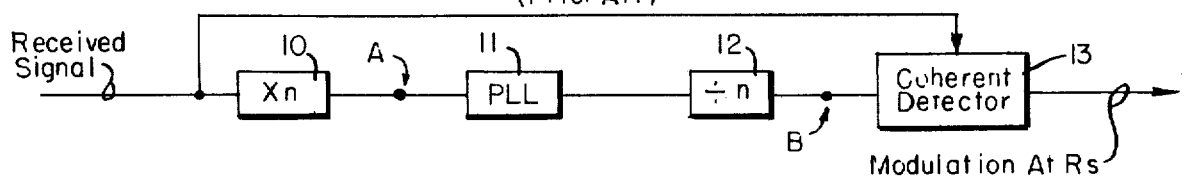
FIG. 1 is a block diagram of a prior art coherent demodulation arrangement.
Figure 2A:
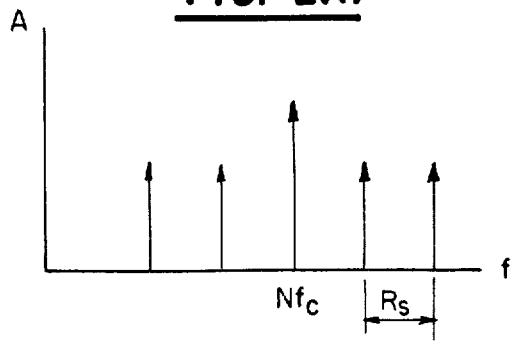
FIGS. 2A, 2B, and 2C are representation of frequency spectra at various points in the circuit of FIG. 1 under various conditions.

Although side lock is a condition which can be generated from a number of causes we will here explore the side lock resulting from an N phase PSK signal modulated at a rate $R_s$. FIG. 1 illustrates a prior art demodulation arrangement for such a signal in which the received signal is provided to a frequency multiplier 10. For an N phase PSK signal a frequency multiplier 10 multiplies the received signal, in frequency, by N (where N equals the number of phases of modulation). If we assume an idealized PSK signal the frequency spectrum of the output of the multiplier 10, at point A in the circuit, would be that shown in FIG. 2A. The intermodulation terms result in a carrier at the frequency $NF_c$ as the original carrier, and side bands, spaced from the multiplied carrier an amount equal to $R_s$ where $R_s$ is the modulation rate. Ideally, the phase lock loop 11 locks onto the multiplied carrier $NF_c$ which is a continuous wave without modulation. After frequency division in divider 12 the frequency spectrum at point B in the circuit comprises a pure signal at frequency $f_c$. This, when applied to the coherent detector 13 enables the original modulation to be derived from the received signal. So long as the frequency uncertainty of $f_c$ were small enough compared to the modulation rate $R_s$, so that the offset between the natural frequency of the voltage controlled oscillator of phase lock loop 11 and the desired lock frequency were small enough the phase lock loop would lock properly. However if the frequency uncertainty was large in comparison with $R_s$ then a side lock condition is possible. To illustrate the problem we can refer now to FIG. 3.

Figure 2B:
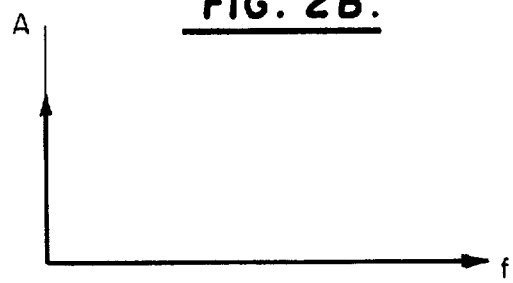
Figure 2C:
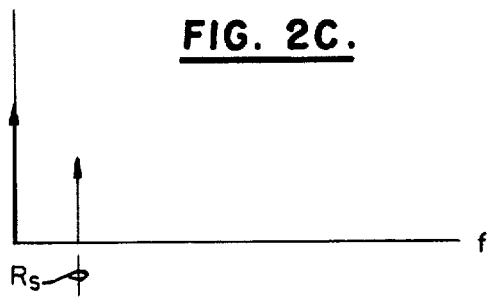
Figure 3:
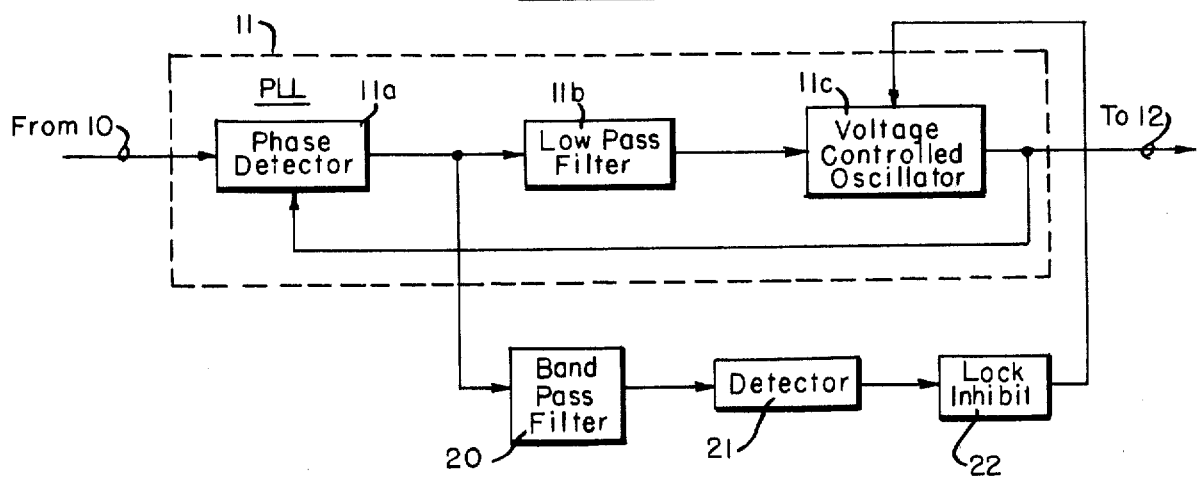
FIG. 3 is a block diagram of an improved phase lock loop which incorporates the inventive side lock detector.

FIG. 3 illustrates a conventional phase lock loop within the dotted lines 11. This includes a phase detector 11a, a low pass filter 11b, and a voltage controlled oscillator 11c whose output is provided to the divider 12 (FIG. 1). The phase detector 11a compares the received signal with the output of the voltage controlled oscillator and provides a signal to the low pass filter 11b which is indicative of the phase difference there between. The phase detector output includes high frequency components which are filtered out by the low pass filter. Thus, the phase difference drives the voltage controlled oscillator to a locked condition where its output frequency is equal to a desired locked frequency as determined by the input to the phase detector. When the phase detector is operating properly on a signal whose frequency spectrum is of the type illustrated in FIG. 2A, the frequency spectrum of the output of the phase detector 11a will be of the type shown in FIG. 2B. In particular, there will be a DC amplitude or error voltage. The contribution from each of the side bands will be cancelled out by the mirror image side band. However, the side lock condition is characterized by the frequency spectrum of FIG. 2C. There we see at least one side band is present at a frequency of $R_s$.

In order to prevent side lock a band pass filter 20, detector 21, and lock inhibit means 22 is connected between the output of the phase detector and the voltage controlled oscillator.

The band pass filter 20 has a center frequency which is equal to $R_s$ and a very narrow pass band. The pass band may be on the order of 60 hertz when the center frequency is on the order of 60 kilohertz. Such filters can be fabricated with crystal tuned circuits.

The output of band pass filter 20 is provided as an input to detector 21 which provides a low frequency or DC signal to lock inhibit means 22. Lock inhibit means 22 is connected to the voltage controlled oscillator 11c.

In operation, if the phase lock loop 11 side locks, the phase detector output will include a significant component at a frequency of $R_s$. This will be passed by band pass filter 20 and detected by detector 21 initiating lock inhibit means 22. Lock inhibit means 22 prevents the voltage controlled oscillator 11c from locking to this frequency in a manner which will be explained hereinafter.

The foregoing explanation has, of course, ignored the noise problem. The use of a multiplier, such as a multiplier 10 enhances noise levels and makes signal to noise ratio threshold significant. To that end, the detector 21 may include a comparator such that only signal levels above a reference will be considered to indicate side lock. Signal levels below such a reference will be considered noise generated.

A further problem to be overcome exists if the voltage controlled oscillator can drift back to the side lock frequency after the lock inhibit means 22 is deenergized. Of course, this could cause the loop to oscillate between a particular side lock and unlocked condition. This would prevent the loop from locking to the desired lock frequency. This condition can be prevented by providing the detector with a suitably long time constant such that by the time lock inhibit means 22 is de-energized the voltage controlled oscillator will have drifted or have been driven sufficiently far from the detected side lock to prevent its return.

Figure 4:
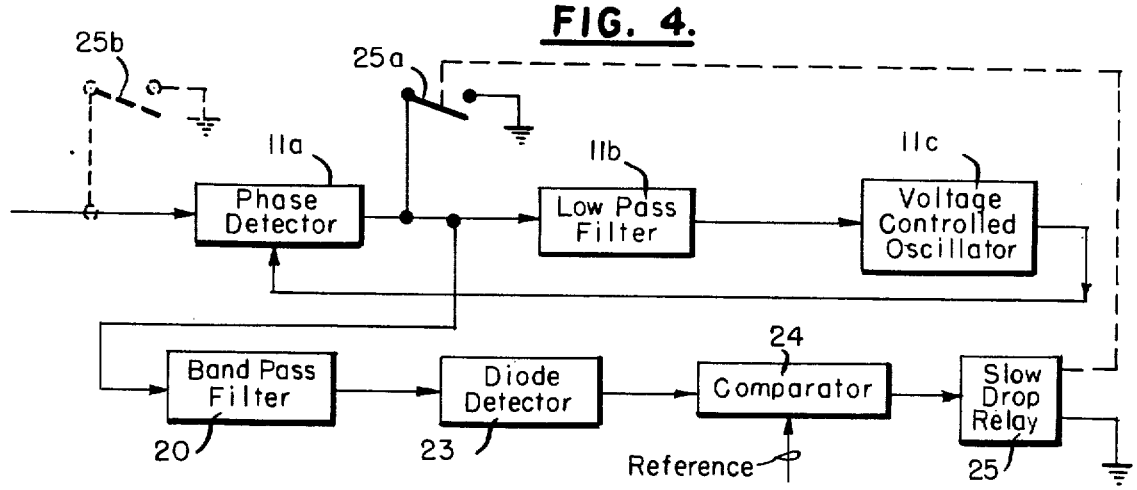
FIG. 4 is a block diagram illustrating a number of alternative implementations of the apparatus of FIG. 3.

One embodiment of the invention is illustrated in FIG. 4 which shows the phase detector 11a, low pass filter 11b and voltage controlled oscillator 11c much in the same manner as that of FIG. 3. The band pass filter 20 is shown as being connected to a diode detector 23. A comparator 24 is provided with the output of diode detector 23 and a reference level. When the diode detector output excedes the reference level comparator 24 provides a signal to relay 25. In order to prevent the loop from oscillating between a side lock and unlocked condition, relay 25 may be made slow drop away. Alternatively, as has been suggested, the diode detector 23 or comparator 24 may be provided with a long time constant. Relay 25 has a contact 25a which is connected between the phase detector and the low pass filter. When the relay is de-energized the contact has no effect on the circuit. However, when the relay is energized, in response to detection of side lock, the output of the phase detector is grounded. In this condition the loop is inhibited from being locked and the oscillator slowly changes frequency. After a sufficient interval, to ensure that the loop does not return to the side lock condition, relay 25 drops out allowing normal loop operation. Instead of connecting relay contact 25a at the output of phase detector 11a it may be connected to the input, as illustrated in dotted portion contact 25b. The location of the relay contact in either location will inhibit the loop from locking when the relay is energized.

Figure 5:
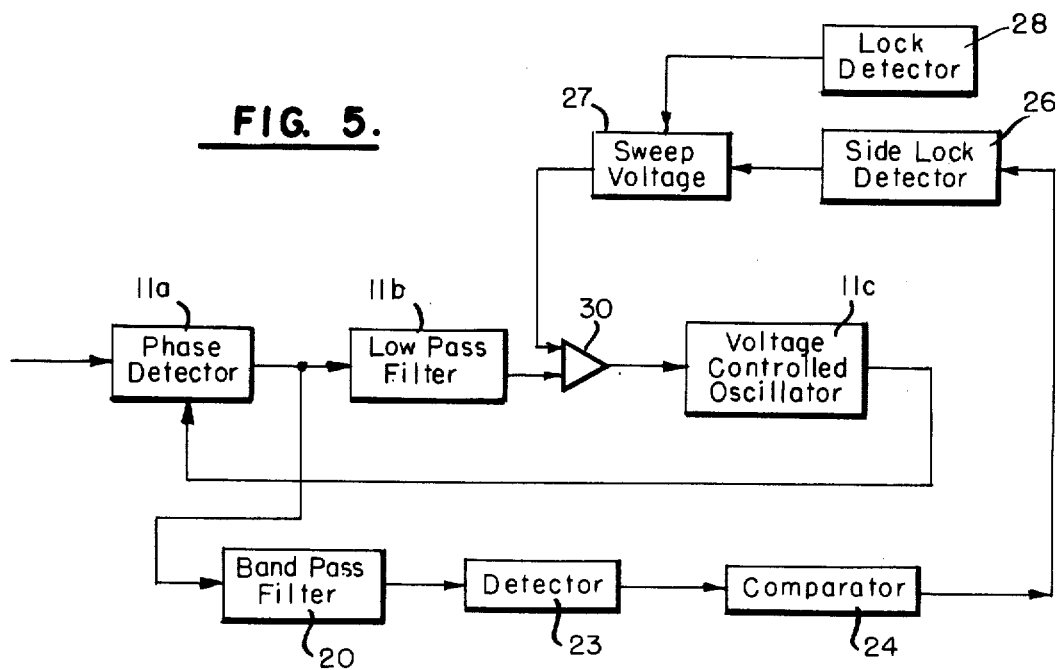
FIG. 5 is still a further implementation of the apparatus of FIG. 3.

In some applications it may be necessary to provide a sweep voltage to the voltage controlled oscillator to ensure that the oscillator sweeps in a preferred direction. FIG. 5 illustrates in the inventive apparatus in combination with such a feature. FIG. 5 illustrates the phase detector, low pass filter and voltage controlled oscillator as shown in FIG. 3 although an amplifier 30 connects the output of low pass filter 11b to the voltage controlled oscillator 11c. A sweep voltage generator provides an additional input to the amplifier 30. Thus, the output of the sweep voltage generator 27 ensures the voltage controlled oscillator will sweep in a preferred direction. The lock detector 28, when a locked condition is detected de-energizes the sweep voltage generator 27 to allow the loop to lock. A lock detector such as lock detector 28 are well known in the art. One example of such a lock detector 28 is illustrated on p. 52 of *Phase Lock Technique* by F. M. Gardner (Wiley, 1966).

The apparatus of FIG. 5 also includes a side lock detector including band pass filter 20, detector 23, and comparator 24. However, in contrast to FIG. 4, comparator 24 provides an input to a side lock detector 26. Side lock detector 26 controls sweep voltage generator 27. In operation, when the loop is out of lock the low pass filter 11b provides an error voltage through amplifier 30 to cause voltage controlled oscillator to approach the desired lock frequency, as detected in the phase detector 11a. The sweep voltage generator 27 ensures that the voltage controlled oscillator sweeps in a preferred direction, or at a preferred rate. When lock is detected lock detector 28 inhibits sweep voltage generator 27 and thus allows the loop to lock. However, if side lock is detected by band pass filter 20, detector 23 and comparator 24, side lock detector 26 again energizes the sweep voltage generator 27 to inhibit the loop from locking up. The circuit of FIG. 5 may well include the long time constant for detector 23 as discussed with respect to FIG. 4.

Those of ordinary skill in the art will understand that although a diode detector has been disclosed any AC to DC converter could be used with equal facility. In addition, the particular reference level for comparator 25 will depend upon the other parameters of the circuit such as the band width of filter 20 and noise levels at the output of the phase detector 11a. Other changes and modifications may be made without departing from the spirit and scope of the present invention and the embodiments illustrated herein should not be construed to limit the scope of the invention which is defined by the claims appended hereto.

I claim:

1. In a synchronous detector an improved phase locked loop to prevent sidelock, said phase locked loop including a phase detector and voltage controlled oscillator the improvement comprising a band pass filter with a narrow pass band and center frequency equal to sideband separation from desired lock frequency, first means connecting said band pass filter to said phase detector, lock inhibit means responsive to energy passed by said band pass filter connected to said phase locked loop to inhibit lock-up when energized, and second means connecting said band pass filter to said lock inhibit means.

2. The apparatus of claim wherein 1 said second means includes a detector.

3. The apparatus of claim 1 wherein said second means includes a diode detector.

4. The apparatus of claim 1 wherein said second means includes a detector with a relatively long time constant.

5. The apparatus of claim 1 wherein said lock inhibit means includes a third means normally in one state and operable to a second state in response to a signal, said third means grounding said phase detector output when operated to said second state to prevent loop lock.

6. The apparatus of claim 1 wherein said lock inhibit means includes a third means normally in one state and operable to a second state in response to signal, said third means grounding said phase detector input when operated to said second state to prevent loop lock.

7. The apparatus of claim 6 wherein said third means remains in said second state for the duration of said signal.

8. The apparatus of claim 7 wherein said third means remains in said second state during said second signal and for a pre-determined time thereafter.

9. The apparatus of claim 5 wherein said third means remains in said second state for the duration of said signal.

10. The apparatus of claim 9 wherein said third means remains in said second state during said second signal and for a pre-determined time thereafter.

11. A method of preventing a phase locked loop including a phase detector and voltage controlled oscillator from achieving sidelock in response to an input signal comprising components at a desired lock frequency and sideband components spaced from said desired lock frequency at multiples of a rate Rs, comprising the steps of, detecting energy at the output of said phase detector at a frequency Rs, and inhibiting loop lock when such energy is detected.

12. The method of claim 11 in which said step of inhibiting continues for a pre-determined time after energy is no longer detected at said Rs rate.

13. Apparatus for preventing a phase locked loop, including a phase detector and voltage controlled oscillator, from achieving side lock in response to an input signal including components at a desired lock frequency and sideband components separated from said desired lock frequency by multiples of Rs, comprising, a band pass filter connected to said phase detector with center frequency Rs and a narrow pass band, and lock inhibit means responsive to energy passed by said band pass filter and connected to said loop to inhibit loop lock in response to energy passed by said band pass filter.

14. The apparatus of claim 13 which includes a detector connecting said band pass filter to said lock inhibit means.

15. The apparatus of claim 14 in which said detector is a diode detector.

16. The apparatus of claim 14 in which said detector has a relatively long time constant.

17. The apparatus of claim 14 in which said detector is a diode detector with a relatively long time constant.

18. The apparatus of claim 13 in which said lock inhibit means includes third means normally in one state and operable to a second state in response to a signal from said band pass filter.

19. The apparatus of claim 18 in which said third means grounds said phase detector output in response to said signal.

20. The apparatus of claim 18 in which said third means grounds said phase detector input in response to said signal.

21. The apparatus of claim 18 in which said third means remains in said second state for the duration of said signal.

22. The apparatus of claim 18 in which said third means remains in said second state for the duration of said signal and for a pre-determined period thereafter.

* * * * *